United States Patent [19]

Owen

[11] 4,420,724

[45] Dec. 13, 1983

[54] FET AMPLIFIER WITH WIDE DYNAMIC RANGE

[75] Inventor: Brian Owen, Upper Milford Township, Lehigh County, Pa.

[73] Assignee: Bell Telephone Laboratories, Incorporated, Murray Hill, N.J.

[21] Appl. No.: 378,739

[22] Filed: May 17, 1982

[51] Int. Cl.³ .......................... H03F 3/16; H03F 3/08
[52] U.S. Cl. ............................. 330/277; 250/214 A; 307/311; 330/290; 330/300; 330/308
[58] Field of Search ................ 330/59, 277, 290, 293, 330/300, 308; 250/214 A; 307/311

[56] References Cited

U.S. PATENT DOCUMENTS 4,053,847  10/1977  Kumahara et al. ................. 330/277

Primary Examiner—James B. Mullins
Attorney, Agent, or Firm—Peter V. D. Wilde

[57] ABSTRACT

A simple method for increasing the dynamic range of a GaAs FET amplifier is described. The drain resistance of the FET is adjusted to induce leakage current across the gate-source junction when excessive power levels are imposed on the gate. This current shunt is provided without added circuit components and therefore does not affect the sensitivity or bandwidth performance of the amplifier.

4 Claims, 7 Drawing Figures

FIG.-1
(PRIOR ART)
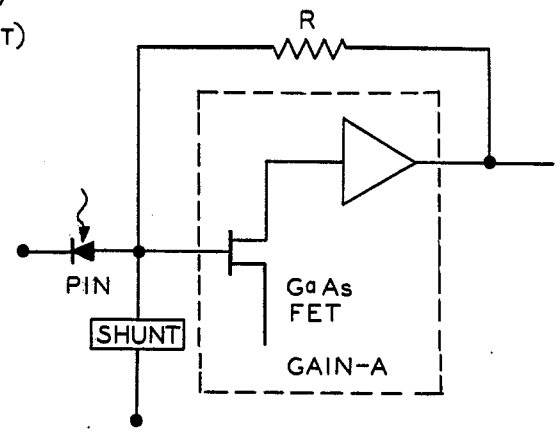
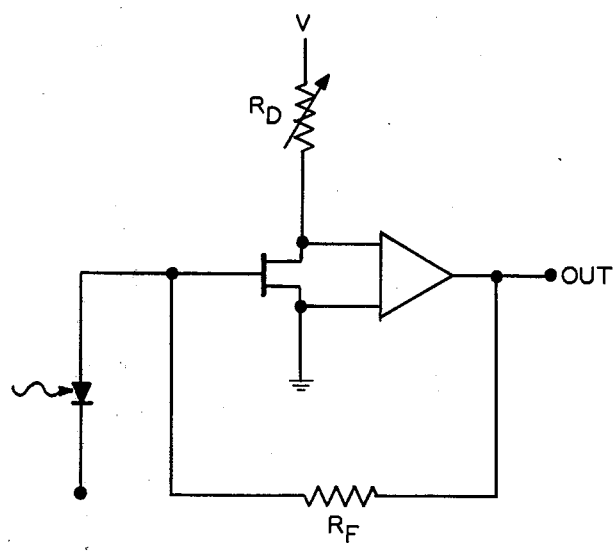
FIG.-2

INPUT POWER = −52.6 dBm
$R_D$ = 151 ohm, $V_g$ = −0.54 volts,
$I_S$ < 10 nA,   $I_D$ = 22.6 mA.

INPUT POWER = −26.5 dBm
$R_D$ = 151 ohm, $V_g$ = −0.52 volts,
$I_S$ < 10 nA,   $I_D$ = 22.8 mA.

INPUT POWER = −26.5 dBm
$R_D$ = 46 ohm, Vg=+0.68 volts,
$I_S$ ≈ 0.15 μA, $I_D$ = 70.0 mA.

INPUT POWER = −7.8 dBm
$R_D$ = 46 ohm, Vg=+0.89 volts,
$I_S$ ≈ 1.5 μA, $I_D$ = 71 mA.

FET AMPLIFIER WITH WIDE DYNAMIC RANGE

BACKGROUND OF THE INVENTION

Present amplifiers for long wavelength PIN-GaAs FET receivers use high-impedance front-ends. The front-end bias resistor is made as large as possible to maximize the signal and to minimize the thermal noise. Unfortunately, this reduces the frequency bandwidth and the signal is integrated by the input capacitance. Long strings of 1's and 0's cause the amplifier to saturate at relatively low input levels thereby restricting the dynamic range.

The most obvious scheme for overcoming this dynamic range problem is to attach a current shunt (field effect transistor, bipolar transistor or a diode) at the input node of the amplifier. The scheme is shown in FIG. 1. As the input signal from the PIN photodiode is increased, the shunt in turned on and the current into the amplifier is limited to a level below saturation. Unfortunately, any connection to the input node adds capacitance to the front-end and a sensitivity penalty is incurred.

STATEMENT OF THE INVENTION

I have discovered an alternative scheme which is simple, practical and involves no additional component connections to the input node. It also relies on a current shunt to limit the current into the amplifier. However, the shunt in this case is provided by forward biasing the gate-source Schottky diode of the front-end GaAs FET itself. No additional component connections to the INPUT node are required to do this, and no sensitivity penalty is incurred.

BRIEF DESCRIPTION OF THE DRAWING

FIG. 1 is a circuit configuration following prior art suggestions of incorporating a shunt element associated with the amplifier front end in order to avoid amplifier saturation;

FIG. 2 is a generalized circuit embodying the alternative to FIG. 1 according to the invention;

DETAILED DESCRIPTION

The scheme is demonstrated in a PIN-GaAs FET receiver operating at 12.6 Mb/s. The generalized circuit is shown in FIG. 2. The receiver normally has an optical dynamic range from −52.6 dBm to −26.0 dB (26.6 dB). The average input current from the PIN photodiode at −26.0 dBm is ∼2.5 μA. This current flows through the 500k ohm feedback resistor developing an output peak-to-peak voltage of ∼2.5 volts. This is sufficient to saturate the amplifier. To prevent this from occurring, the bias on the gate of the FET is increased to forward bias the gate-source Schottky diode. An advantageous way of doing this is to decrease the drain resistor, $R_D$. Since the drain voltage of the FET is clamped to approximately +1.5 volts (by a PNP transistor, see FIG. 3), decreasing the drain resistor increases the drain current, $I_D$. The gate voltage is then automatically adjusted for that increased drain current through the feedback resistor, $R_F$. If the reduction in $R_D$ is sufficient, the gate-voltage will go positive, forward biasing the gate-source. The excess input current is then shunted to ground. The shunting may be done gradually or at a discrete level close to −26.0 dBm. The shot noise introduced by the forward-biased gate-source diode is insignificant at this input light level, and no errors are made.

Figure 3:
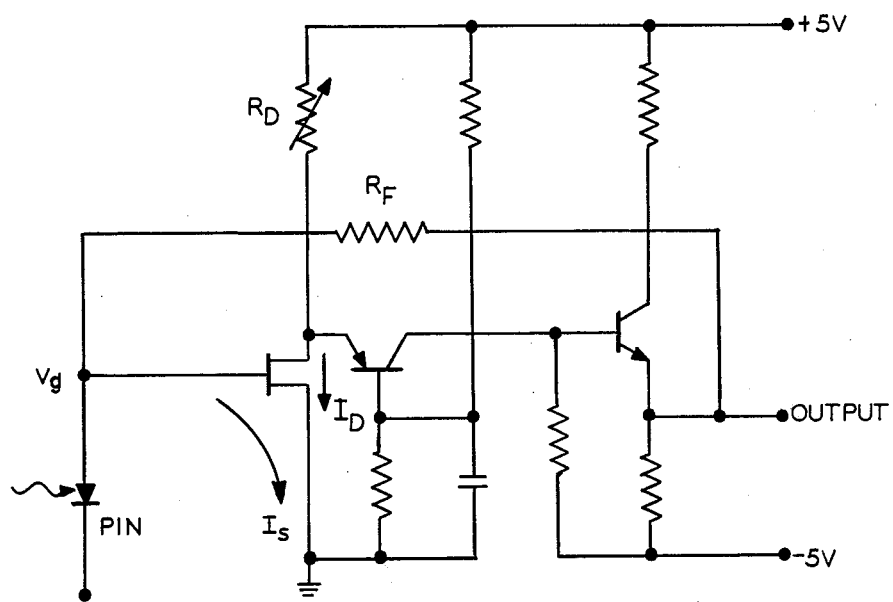
FIG. 3 is a specific circuit implementation of the circuit of FIG. 2.

The effectiveness of this shunt circuit was demonstrated using the amplifier configuration shown in FIG. 3. This amplifier employs a GaAs field effect transistor in the front-end. It is a transimpedance amplifier with direct coupled stages in a hybrid complementary configuration. The use of a GaAs FET in the amplifier is preferred due to the small gate capacitance and high transconductance characteristic of this device. These properties impart to the circuit high sensitivity and low noise, qualities needed for sensing low level, high frequency signals such as those generated in advanced lightwave communications systems. However, the circuit undoubtedly has functional advantages in other applications where wide ranges of incoming signal power are encountered. Although the transconductance amplifier shown in FIG. 3 is regarded as having merit in this application, other circuit arrangements are useful also. Cascade amplifiers with high input resistance will also give good noise performance, although the bandwidth tends to be more limited.

The amplifier of FIG. 3 comprises the GaAs FET front-end, and two complementary microwave transistors. See *Electronics Letters*, Vol. 15, No. 20, Sept. 27, 1979, pp. 650–653. See also, D. R. Smith et al, "PIN Photodiode Hybrid Optical Receivers," *Proceedings of the Optical Communication Conf.*, Amsterdam, Sept. 17–19, 1979. These devices are capable of operation at frequencies in excess of 4 GHz. The GaAs FET operates with 5–15 mA of drain current and −0.4 to −0.8 v on the gate. The p-n-p transistor clamps the DC level of the FET drain, and the n-p-n transistor is connected in an emitter follower configuration to lower the output impedance. The feedback resistor is chosen to have a high value, e.g., 500k ohm, for sensitivity. Since the drain voltage is clamped, a reduction in $R_D$ (or alternatively an increase in bias voltage) will cause the drain current to increase as described earlier. The increased voltage at the output is fed back to the FET gate through the feedback resistor $R_F$. When the gate voltage reaches a positive value, current is injected across the gate source junction and shunted to ground as shown in FIG. 3. It is characteristic therefore of this shunt arrangement that significant leakage current across the junction is intentionally caused to flow when the amplifier is in danger of being overpowered. That utilization of the MESFET is regarded as a substantial technological contribution. Other types of transistors, which allow significant gate-to-source current flow, can be used as well.

Figure 4A:
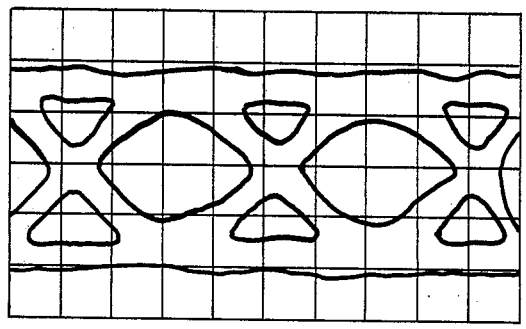
FIGS. 4A–4D are eye diagram demonstrations (using the parameters indicated) of the circuit of FIG. 3.
Figure 4B:
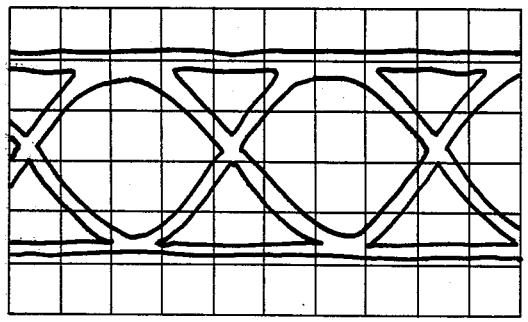
Figure 4C:
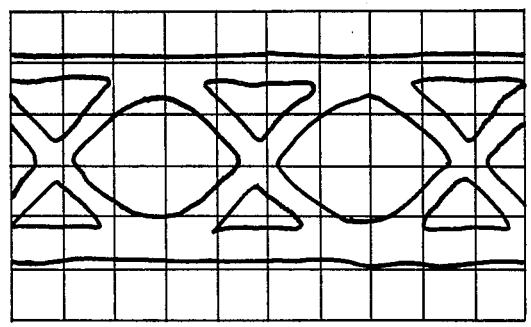
Figure 4D:
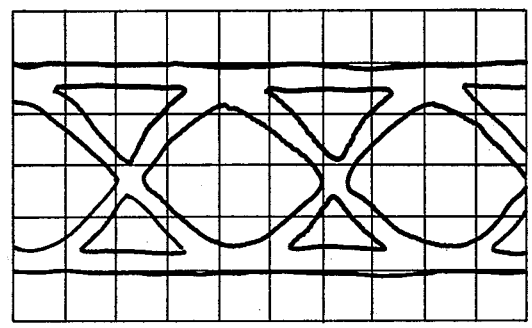

To demonstrate operation of this wide dynamic range receiver, the drain current was increased by decreasing $R_D$ manually at a discrete level. The measurements were made using a 12.6 Mb/s pseudo-random NRZ optical signal from a 1.3 μm laser. The receiver was combined with a regenerator and retiming circuit. FIGS. 4A and 4B show the eye diagrams at input power levels of −52.6 dBm and −26.5 dBm, respectively. The corresponding gate voltage, Vg, drain resistor, $R_D$, drain current, $I_D$, and shunt current, $I_S$, are also shown. The gate voltage is negative and the shunt current is <10 nA (this is normal FET gate leakage current). At the −26.5 dBm optical input level, $R_D$ was decreased manually from 151 ohms to 46 ohms. The gate voltage Vg goes positive (+0.68 volts) and the gate-source Schottky diode conducts. As measured on a similar FET, the d.c. shunt current $I_S$ at this bias was ~0.15 mA. An equalization adjustment was used to compensate for the increased capacitance of the forward-biased, gate-source junction. FIG. 4C shows the eye diagram at −26.5 dBm after the $R_D$ adjustment was made. The eye diagram clearly shows the increased shot noise contribution of the shunt current. No errors were made. The input power level was then increased to −7.8 dBm (FIG. 4D) with no further equalization adjustment. This is the maximum power available from the 1.3 μm laser transmitter used in the test. The gate voltage increased to +0.89 volts and the d.c. shunt current to ~1.5 μA. No errors were made.

What is claimed is:

1. Amplifier for amplifying signals over a wide dynamic range from a first level to a second level higher than the first, the amplifier comprising a field effect transistor having a Schottky gate, means connecting the signal to be amplified to the Schottky gate, feedback means for adjusting the voltage on the Schottky gate in accordance with the voltage on the drain of the field effect transistor, and means for biasing the drain of the field effect transistor at a level producing substantial current flow from the Schottky gate to the source of the transistor over a significant part of said dynamic range near said second level.

2. Photoelectric conversion apparatus comprising a photosensitive element for converting light signals into electrical pulses, said pulses having current values over a wide dynamic range from a first level to a second level higher than the first, and amplifier means for amplifying the pulses over said wide dynamic range, said amplifier comprising a field effect transistor having a Schottky gate, means connecting the output of the photosensitive element to the Schottky gate, feedback means for adjusting the voltage on the Schottky gate in accordance with the voltage on the drain of the field effect transistor, and means for biasing the drain of the field effect transistor at a level producing substantial current flow from the Schottky gate to the source of the transistor over a significant part of said dynamic range near said second level.

3. The apparatus of claim 2 in which the field effect transistor is a MESFET.

4. The apparatus of claim 3 in which the MESFET comprises GaAs.

* * * * *